United States Patent
Li et al.

(10) Patent No.: US 7,301,769 B2
(45) Date of Patent: Nov. 27, 2007

(54) FAN HOLDER

(75) Inventors: Dong-Yun Li, Shen-Zhen (CN); Min Li, Shen-Zhen (CN); Hong-Cheng Yang, Shen-Zhen (CN); Hong-Bo Shi, Shen-Zhen (CN)

(73) Assignees: Fu Zhun Precision Industry (Shenzhen) Co., Ltd., Bao'an District, Shenzhen, Quangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 269 days.

(21) Appl. No.: 11/220,732

(22) Filed: Sep. 7, 2005

(65) Prior Publication Data

US 2006/0056152 A1 Mar. 16, 2006

(30) Foreign Application Priority Data

Sep. 15, 2004 (CN) .................. 2004 2 0088417

(51) Int. Cl.
*H05K 7/20* (2006.01)
*H01B 7/42* (2006.01)
*H01L 23/34* (2006.01)
*F28F 7/00* (2006.01)

(52) U.S. Cl. ............... 361/697; 361/694; 361/695; 174/16.1; 174/16.3; 257/718; 257/722; 165/80.3; 165/185; 165/122

(58) Field of Classification Search ........... 361/694, 361/695, 697; 174/16.1, 16.3; 257/718, 257/722; 165/80.3, 185, 122
See application file for complete search history.

(56) References Cited

U.S. PATENT DOCUMENTS

| | | | |
|---|---|---|---|
| 5,477,916 A | 12/1995 | Lin | |
| 5,493,475 A | 2/1996 | Lin | |
| 5,519,574 A | 5/1996 | Kodama et al. | |
| 5,678,627 A * | 10/1997 | Lee | 165/80.3 |
| 6,311,766 B1 * | 11/2001 | Lin et al. | 165/80.3 |
| 6,392,885 B1 * | 5/2002 | Lee et al. | 361/697 |
| 6,435,467 B1 * | 8/2002 | Lai | 248/500 |
| 6,449,152 B1 | 9/2002 | Lin | |
| 6,600,650 B1 * | 7/2003 | Lee | 361/697 |
| 7,038,913 B2 * | 5/2006 | Lee et al. | 361/709 |
| 7,089,999 B1 * | 8/2006 | Wu et al. | 165/80.3 |
| 7,131,485 B2 * | 11/2006 | Yu et al. | 165/80.3 |
| 2004/0000398 A1 * | 1/2004 | Lee et al. | 165/185 |
| 2007/0119567 A1 * | 5/2007 | Yeh et al. | 165/80.3 |

* cited by examiner

*Primary Examiner*—Jayprakash Gandhi
*Assistant Examiner*—Zachary M Pape
(74) *Attorney, Agent, or Firm*—Morris Manning Martin LLP; Tim Tingkang Xia, Esq.

(57) ABSTRACT

A fan holder (1) includes a base (12) for supporting a fan (3) thereon and a pair of locking members (14) pivotally connected to the base. Each of the locking members includes a pivot shaft (142) and a handle (144) extending perpendicularly from the pivot shaft. The pivot shaft includes a pivot section (1422) and a pressing section (1426) offsetting from the pivot section and spaced from the base, wherein the handle is capable of rotating about an axis of the pivot shaft to lock with the base and to cause the pressing section to exert a force against the fan toward the base to securely attach the fan to the base.

19 Claims, 7 Drawing Sheets

FAN HOLDER

BACKGROUND

1. Field

The present invention relates to a fan holder attached to a heat sink, and more particularly to a fan holder conveniently securing a fan onto a heat sink.

2. Related Art

Numerous modern electronic devices such as central processing units (CPUs) of computers generate large amounts of heat during operation. The heat must be efficiently removed from the CPU; otherwise, abnormal operation or damage may result. Typically, a heat sink is attached on the CPU to remove heat therefrom. A fan is mounted on top of the heat sink to enhance heat dissipation efficiency.

The fan commonly defines four through holes in four corners of a frame thereof. Four screws are inserted through the through holes of the frame and engaged with fins of the heat sink, thereby securing the fan to the heat sink. However, the fins of the heat sink are normally relatively thin, and are prone to be deformed or damaged when the screws are engaged therewith. When this happens, the screws are easily loosened or even disengaged from the fins. When the fan is no longer securely mounted on the heat sink, the fan may operate less efficiently and cause noise.

SUMMARY

Accordingly, what is needed is a fan holder which safely and conveniently secures a fan to a heat sink.

A fan holder in accordance with a preferred embodiment of the present invention comprises a base for supporting a fan thereon and a pair of locking members pivotally connected to the base. Each of the locking members comprises a pivot shaft and a handle extending perpendicularly from the pivot shaft. The pivot shaft comprises a pivot section and a pressing section offsetting from the pivot section and spaced from the base, wherein the handle is capable of rotating about an axis of the pivot shaft to lock with the base and to cause the pressing section to exert a force against the fan toward the base to securely attach the fan to the base.

Other advantages and novel features of the present invention will become more apparent from the following detailed description when taken in conjunction with the accompanying drawings, in which:

DETAILED DESCRIPTION OF THE INVENTION

Figure 1:
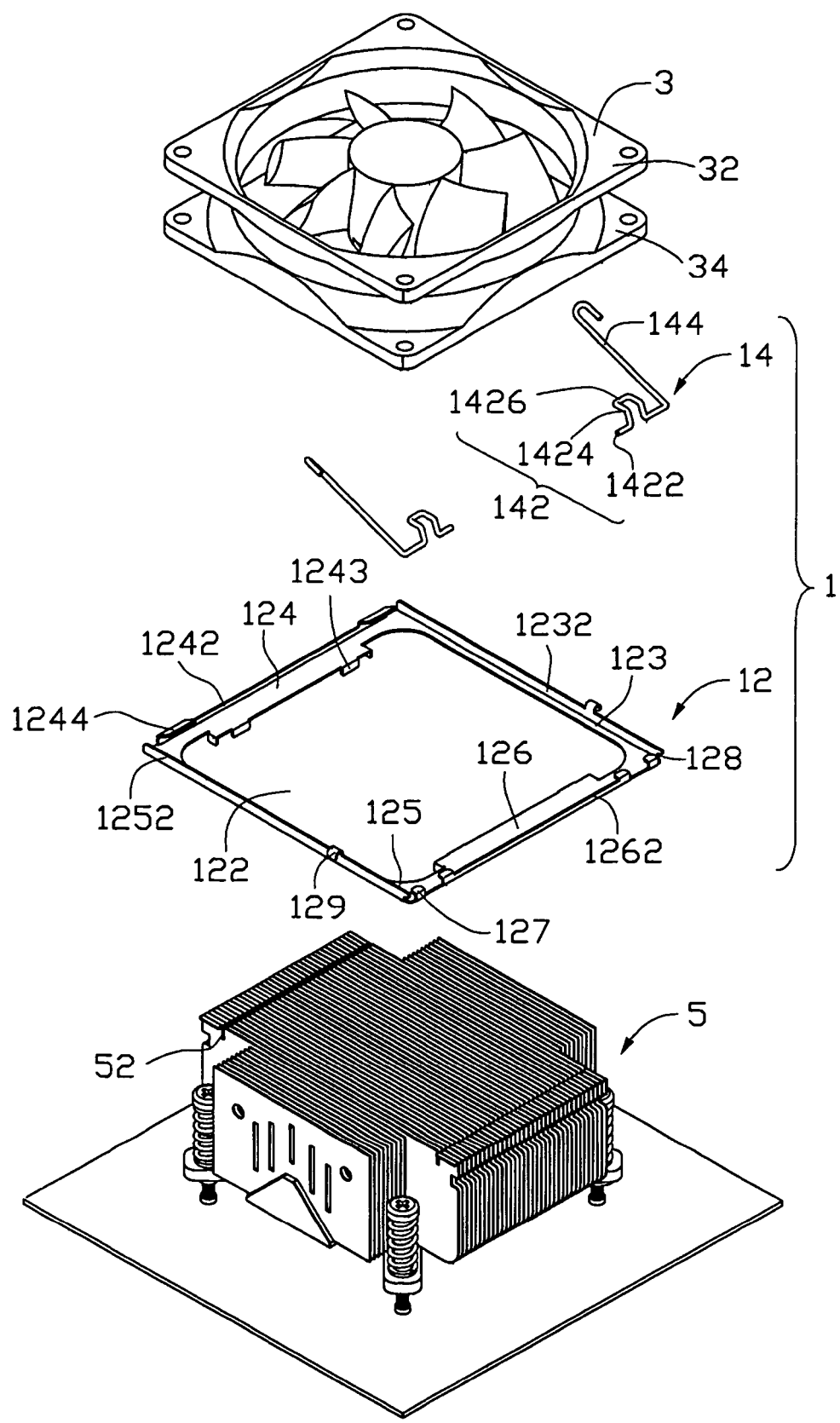
FIG. 1 is an exploded, isometric view of a fan holder in accordance with a preferred embodiment of the present invention, together with a fan, a heat sink mounted on a printed circuit board.

Referring to FIG. 1, a fan holder 1 for mounting a fan 3 to a heat sink 5 comprises a base 12 and two locking members 14 pivotally connected to the base 12. The fan 3 comprises a frame having a rectangular configuration. The frame comprises a top plate 32 and a bottom plate 34. The heat sink 5 comprises a pair of grooves 52 defined in a top of the heat sink 5.

The base 12 holds the heat sink 5 thereunder and supports the fan 3 thereon. An opening 122 is defined in a center of the base 12 for providing an air access from the fan 3 to the heat sink 5. In detail, the base 12 comprises four beams 123, 124, 125, 126 at a periphery of the opening 122. The beam 123 is parallel to the beam 125 and is perpendicular to the beams 124, 126 which are parallel to each other. Four flanges 1232, 1242, 1252, 1262 extend upwardly from outer edges of the beams 123, 124, 125, 126 respectively to form a substantially rectangular space to accommodate the fan 3 therein. A plurality of engaging members 1243 extends downwardly from inner edges of the opposite beams 124, 126 to engage within the grooves 52 defined in the top of the heat sink 5, wherein only the engaging members 1243 located on the beam 124 are completely visible in FIG. 1. The fan holder 1 is securely mounted on the heat sink 5 via the engaging members 1243 in engagement with the grooves 52 or via welding. A pair of spaced blocking flakes 1244 extends upwardly and inwardly from the flange 124 to block the fan 3 from departing from the base 12. Four spaced tabs 127 extend upwardly from the flange 1262 and then are bent inwardly to thereby define a receiving space (not labeled) between the tabs 127 and the base 12 to pivotally receive and position the locking members 14. The tabs 127 are disposed at two opposite sides of the flange 1262. A pair of cutouts 128 is defined in two adjacent corners of the base 12, respectively, located between the flanges 1232, 1252 and the tabs 127 adjacent to the flanges 1232, 1252, as clearly shown in FIG. 3. A C-shaped ear 129 is outwardly formed on each of the flanges 1232, 1252 of the base 12.

Figure 2:
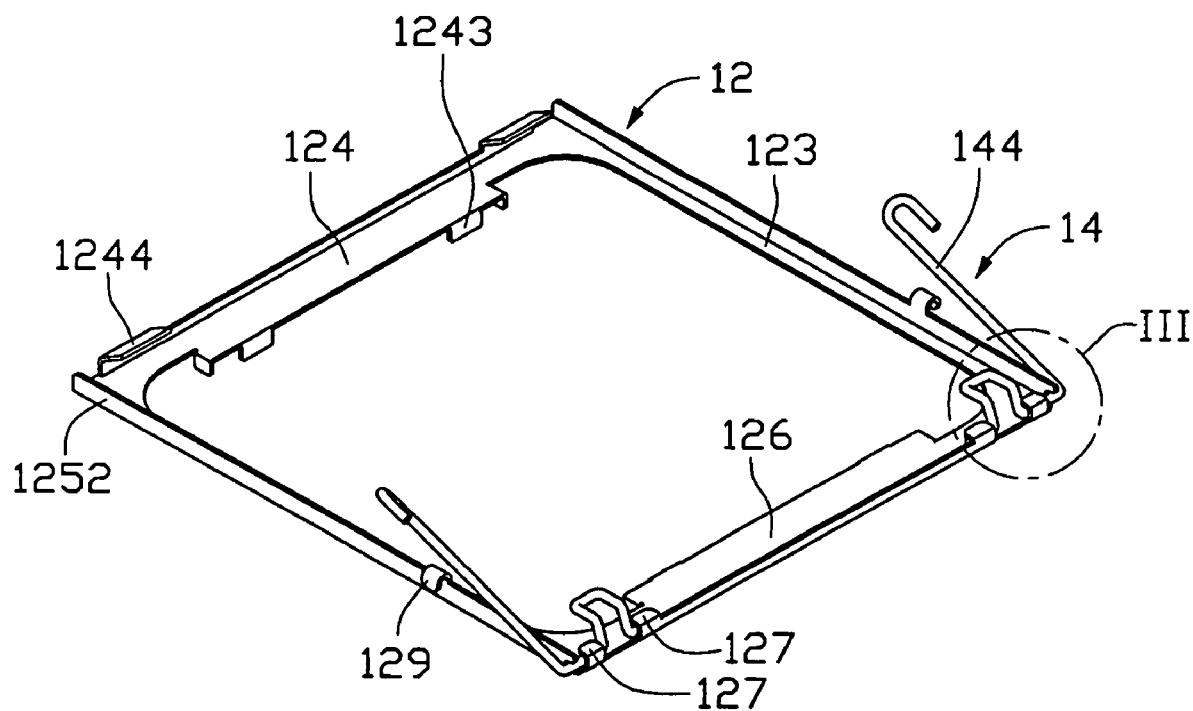
FIG. 2 is an isometric view of the fan holder of FIG. 1.

Referring to FIGS. 1 and 2, each locking member 14 is substantially L-shaped with a pivot shaft 142 and a handle 144 extending perpendicularly from one end of the pivot shaft 142. The pivot shaft 142 comprises two pivot sections 1422 substantially in line with each other to define a pivoting axis, a pair of connecting sections 1424 extending perpendicularly from two ends of the pivot sections 1422, respectively, and a U-shaped pressing section 1426 formed on a top of the connecting sections 1424 and connected to the pivot sections 1422 via the connecting sections 1424. The pressing section 1426 offsets from the pivot sections 1422. The pressing section 1426 is disposed in a plane parallel to the base 12 and perpendicular from the connecting sections 1424. The handle 144 is angled to the base 12 and the connecting sections 1424 when the pivot sections 1422 of the locking member 14 is pivotally positioned between the tabs 127 and the base 12 (clearly seen in FIG. 2). A free end of the handle 144 is folded back for facilitating an operation of the locking member 14. The locking members 14 can be made of metal wire.

Figure 3:
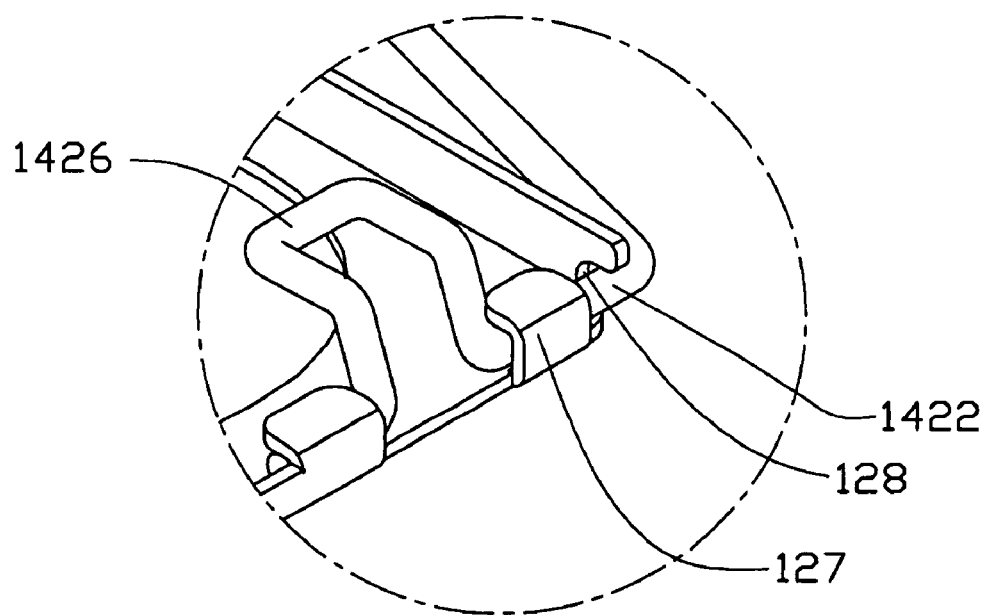
FIG. 3 is an enlarged view of a circled part III of FIG. 2.

Referring particularly to FIGS. 2 and 3, in assembly, the pivot sections 1422 of each locking member 14 are lodged in the receiving space between the tabs 127 and the base 12. The pressing section 1426 of each locking member 14 is located between adjacent two tabs 127. Each cutout 128 receives a corresponding locking member 14 at a conjunction of the locking member 14 between the handle 14 and the pivot section 1422. Thus, the locking members 14 are pivotally assembled to the base 12. On this point, the handles 144 are disposed beyond the flanges 1232, 1252 and can rotate around the axes determined by the pivot sections 1422 from an unlocked position at which the handles 144 are angled to the base 12 and the U-shaped pressing sections 1426 are away from the frame of the fan 3 to a locked position at which the handles 144 are parallel to the base 12 and are locked under the corresponding ears 129 and the pressing sections 1426 are firmly pressed on the bottom plate 34 of the frame of the fan 3.

Figure 4:
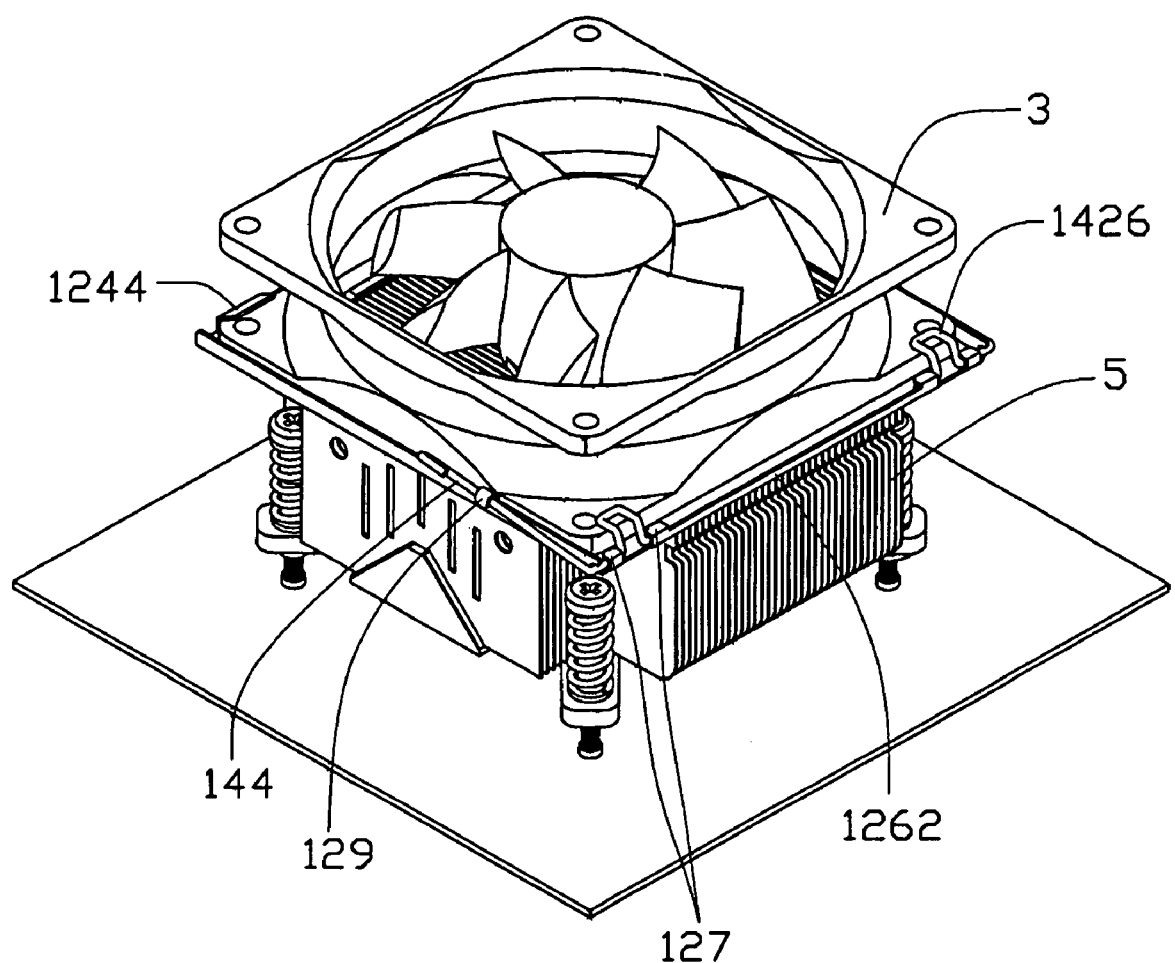
FIG. 4 is an assembled view of FIG. 1.

Referring to FIG. 4, in operation, the fan holder 1 is mounted on the top of the heat sink 5. Initially, the handles 144 are located at the unlocked position at which the angle between the handles 144 and the base 12 is about 90 degrees so that the pressing sections 1426 allow the fan 3 to be placed on the base 12. The fan 3 is placed on top of the base 12. The blocking flakes 1244 contact a top of the bottom plate 34 of the frame of the fan 3 to prevent the fan 3 from departing from the base 12. Then, the handles 144 are rotated with respect to the axes of the pivot shafts 142 to cause the pressing sections 1426 to move toward the bottom plate 34 of the frame of the fan 3. When the angle between the handles 144 and the base 12 changes to about 45 degrees, the pressing sections 1426 contact the bottom plate 34 of the frame of the fan 3. When the handles 144 are finally locked with corresponding ears 129, the pressing sections 1426 engagingly press the bottom plate 34 of the frame of the fan 3 downward and generate downward force against the bottom plate 34. Thus, the fan 3 is securely mounted onto the fan holder 1.

To detach the fan 3 from the fan holder 1, the handles 144 are detached from the ears 129 and rotated with respect to the axes of the pivot shafts 142 to cause the pressing sections 1426 to move away from the bottom plate 34 of the frame of the fan 3. Then the fan 3 can be removed away from the base 12.

Figure 5:
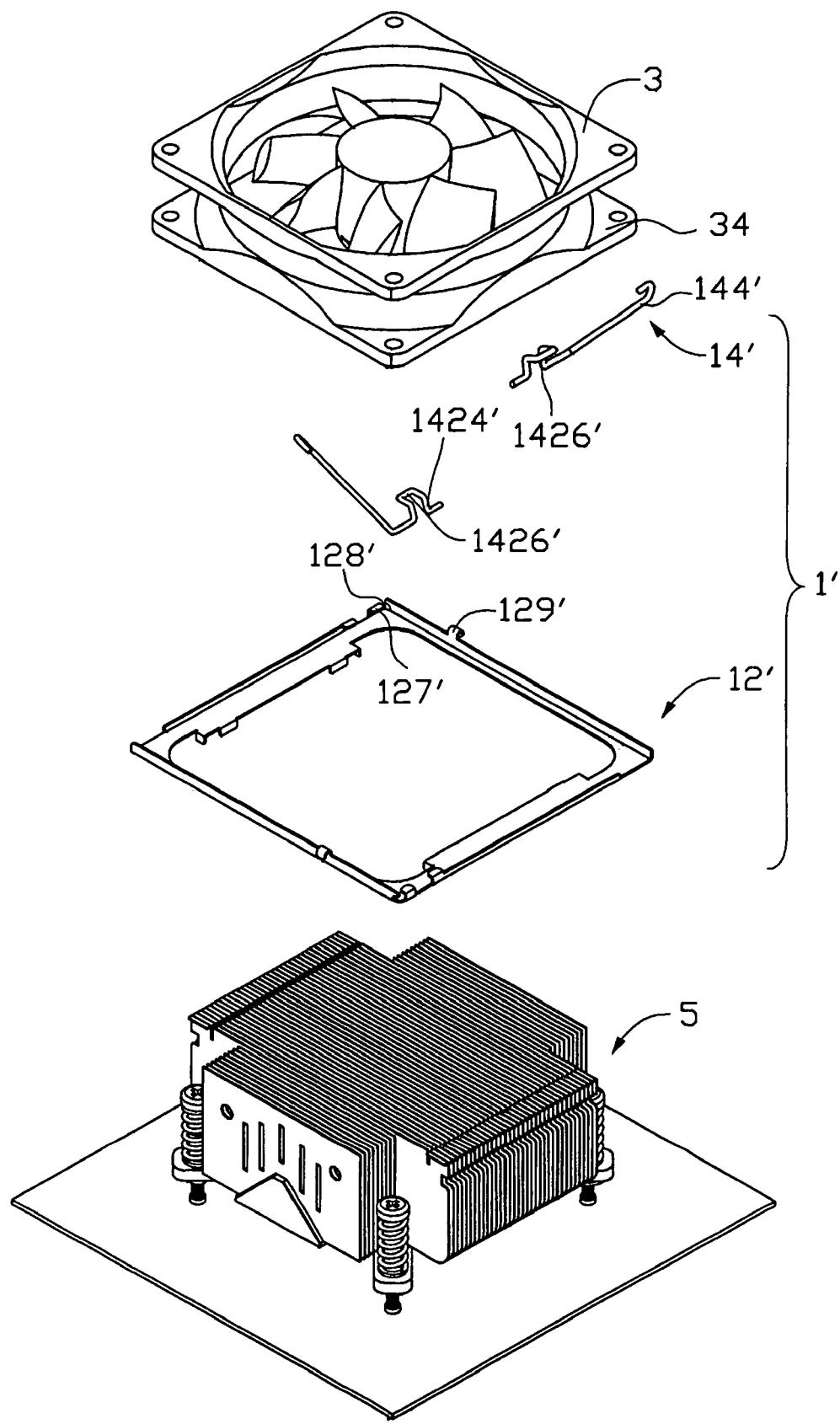
FIG. 5 is an exploded, isometric view of a fan holder in accordance with a second preferred embodiment of the present invention, together with a fan, a heat sink mounted on a printed circuit board.
Figure 6:
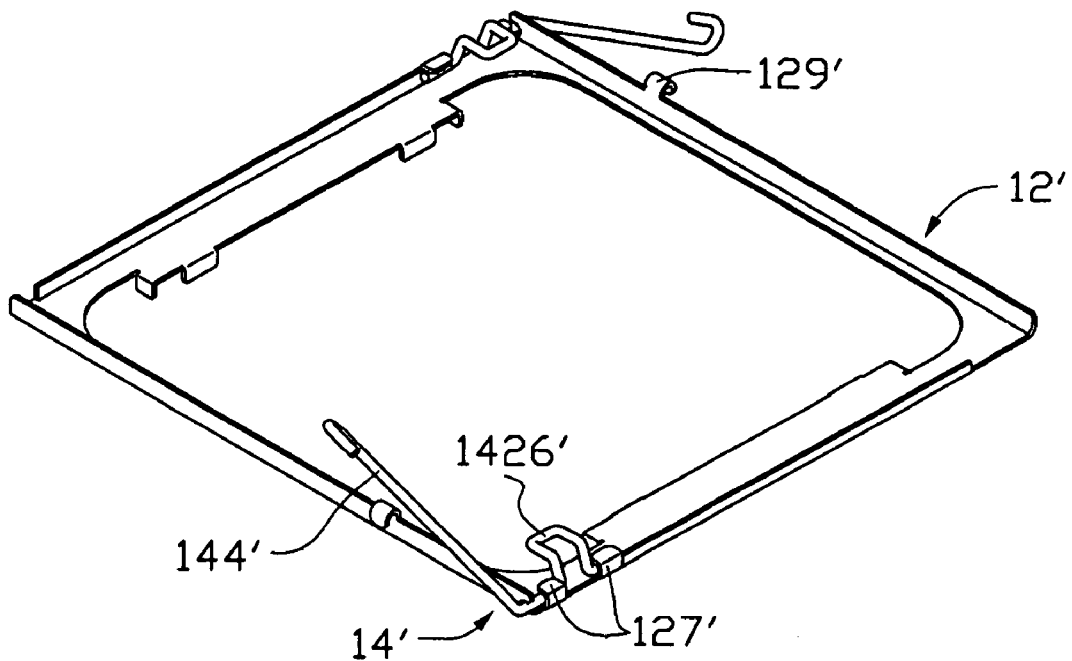
FIG. 6 is an isometric view of the fan holder of FIG. 5.
Figure 7:
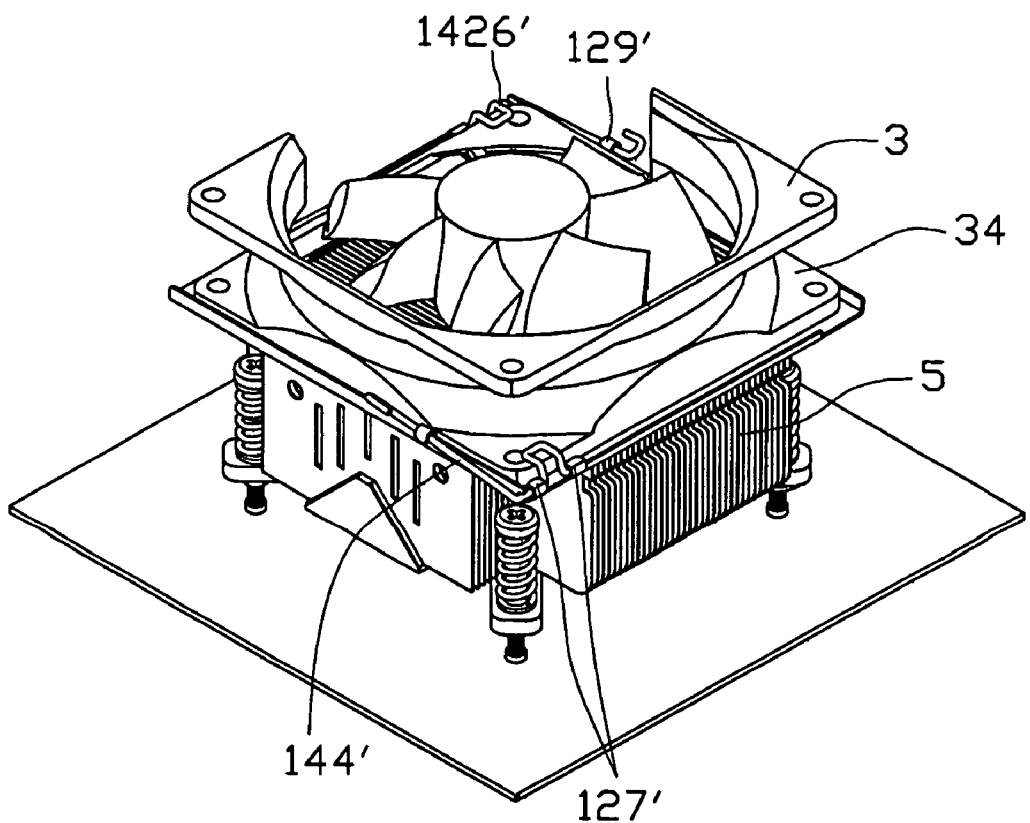
FIG. 7 is an assembled view of FIG. 5, but with a part of the fan being cut away to more clearly show a relationship between the fan and the fan holder.

FIGS. 5-7 illustrate a fan holder 1' according to a second preferred embodiment of the present invention. The main difference between the second preferred embodiment and the first embodiment is that the locking members 14' are pivotally connected to a base 12' at two diagonal corners of the base 12', wherein tabs 127', cutouts 128' and ears 129' are formed on the base 12' and adjacent to corresponding locking members 14'. The blocking flakes 1244' shown in the first embodiment are left out in this second embodiment. Other elements and operation of the second preferred embodiment can be referenced to the description of the first preferred embodiment and omitted herewith.

Figure 8:
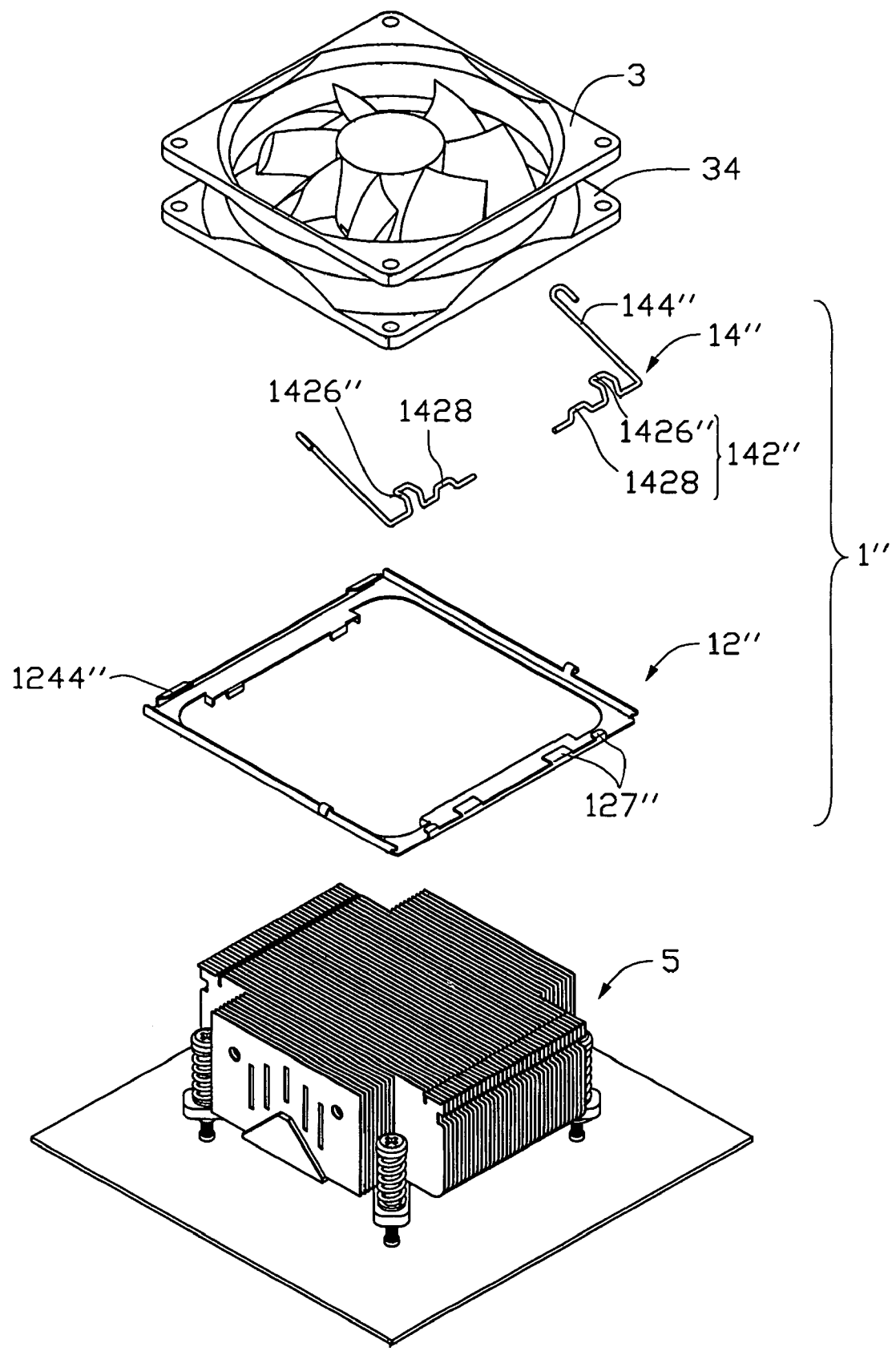
FIG. 8 is an exploded, isometric view of a fan holder in accordance with a third preferred embodiment of the present invention, together with a fan, a heat sink mounted on a printed circuit board.
Figure 9:
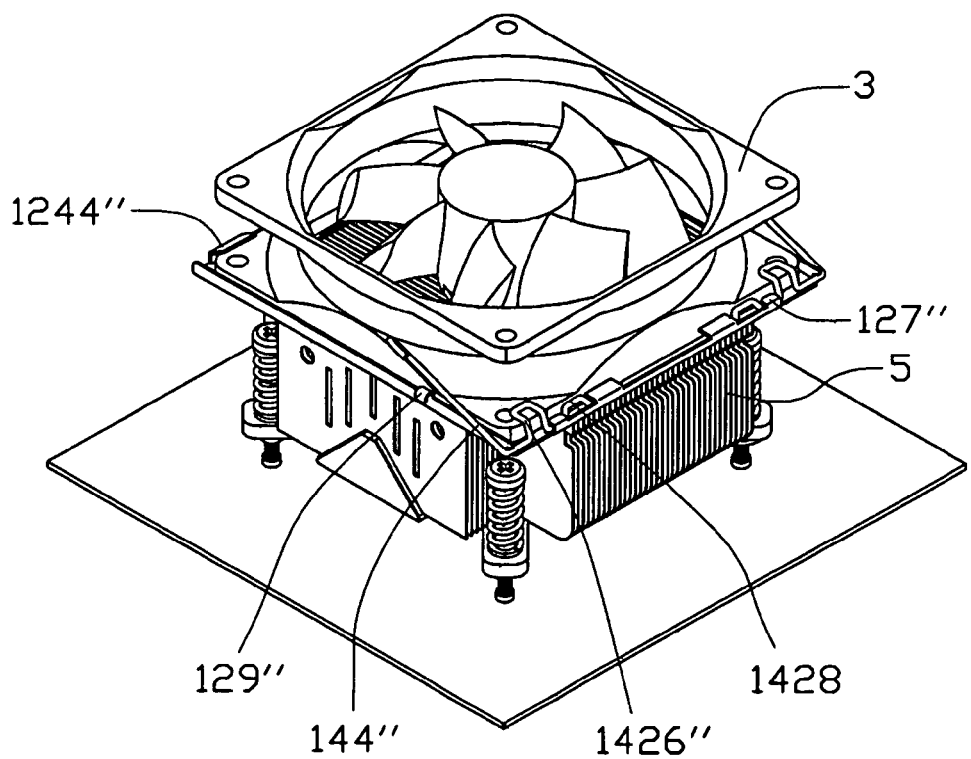
FIG. 9 is an assembled view of FIG. 8, but the fan is in an unlocked position.
Figure 10:
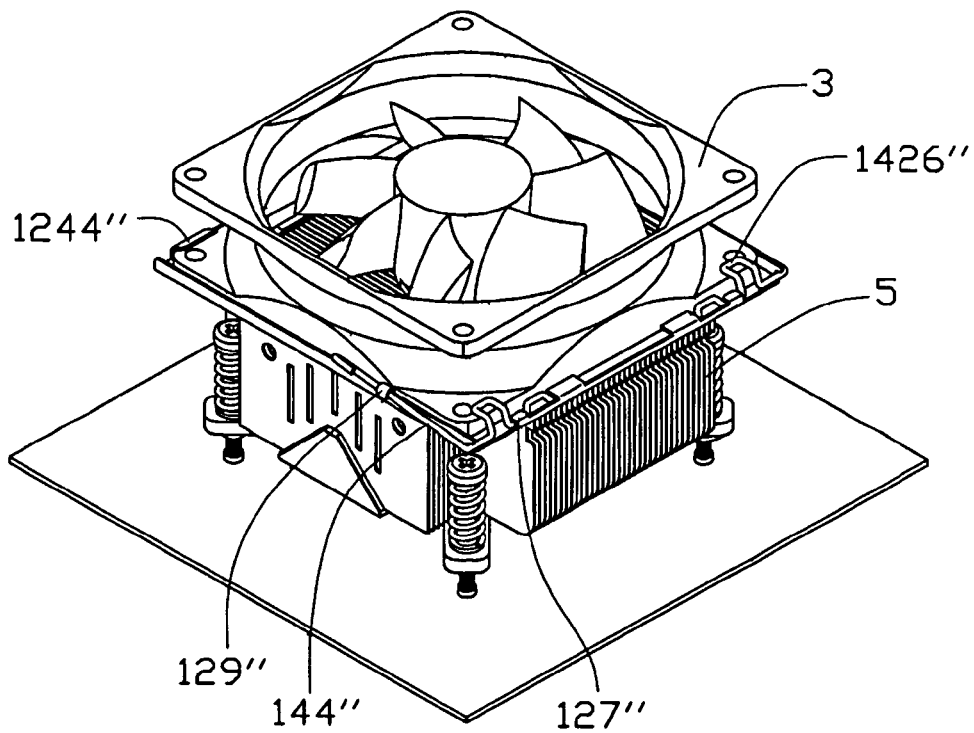
FIG. 10 is a view similar to FIG. 9 with the fan in a locked position.

FIGS. 8-10 illustrate a fan holder 1" according to a third preferred embodiment of the present invention. The main difference between the third preferred embodiment and the first embodiment is that each locking member 14" further comprises a pushing section 1428 between a free end of the pivot shaft 142" and the pressing section 1426". The pushing section 1428 offsets from a pivot section (not labeled) of the pivot shaft 142" and has a profile lower than that of the pressing section 1426". The pushing section 1428 is disposed between the corresponding adjacent tabs 127" when the locking member 14" is assembled to the base 12". Operation is similar to that of the first preferred embodiment. When the fan 3 is attached to the base 12", the handles 144" are rotated from their unlocked position to their locked position. First, the pushing sections 1428 push the fan 3 toward the blocking flakes 1244 to accurately locate the fan 3 on the base 12" before the pressing sections 1426" contacting the bottom plate 34 of the frame of the fan 3. Then the pressing sections 1426" contact the bottom plate 34 of the frame of the fan 3 and press the fan 3 downward. Thus, the fan 3 is securely mounted on the fan holder 1".

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A fan holder comprising:
   a base for supporting a fan thereon; and
   a pair of locking members pivotally connected to the base, each of the locking members comprising:
   a pivot shaft comprising a pivot section and a pressing section offsetting from the pivot section and spaced from the base; and
   a handle extending perpendicularly from the pivot shaft, and being capable of rotating about an axis of the pivot shaft to lock with the base and to cause the pressing section to exert a force against the fan toward the base to securely attach the fan to the base.

2. The fan holder as claimed in claim 1, wherein the base comprises four beams and four flanges extending from the four beams respectively.

3. The fan holder as claimed in claim 1, wherein two pairs of spaced tabs extend upwardly and then inwardly from the base to define spaces between the tabs and the base to pivotally receive and position the pivot sections of the pivot shafts therein respectively.

4. The fan holder as claimed in claim 3, wherein the pressing sections are disposed between adjacent two of the tabs respectively when the locking members are pivotally connected to the base.

5. The fan holder as claimed in claim 1, wherein a pair of ears is formed on the base to engage with the handles when the handles lock with the base.

6. The fan holder as claimed in claim 1, wherein each of the locking members further comprises a connecting section extending from the pivot section and connecting the pressing section to the pivot section.

7. The fan holder as claimed in claim 6, wherein the locking members are positioned at adjacent corners of the base.

8. The fan holder as claimed in claim 6, wherein the locking members are positioned at diagonal corners of the base.

9. The fan holder as claimed in claim 1, wherein the base comprises a pair of spaced blocking flakes extending upwardly and inwardly therefrom and opposite to the locking members.

10. The fan holder as claimed in claim 9, wherein each of the locking members further comprises a pushing section between a free end of the pivot section and the pressing section, and the pushing sections push the fan toward the blocking flakes when the handles are rotated to lock with the base.

11. A heat dissipation device comprising:
a heat sink;
a fan comprising a plate; and
a fan holder comprising:
engaging members for securing the fan holder with the heat sink;
a base supporting the fan thereon;
flanges extending perpendicularly from the base and enclosing the plate of the fan therein, one of the flanges forming an outer ear; and
a locking member being pivoted to the base and comprising a handle lockable under the outer ear and a pressing section exerting a force on a top of the plate when the handle is locked under the out ear.

12. The heat dissipation device as claimed in claim 11, wherein the locking member is made of a metal wire.

13. The heat dissipation device as claimed in claim 11, wherein the locking member further comprises a pivot shaft extending perpendicularly from the handle, and the pressing section offsetting from the pivot shaft.

14. The heat dissipation device as claimed in claim 13, wherein the locking member is L-shaped.

15. The heat dissipation device as claimed in claim 13, wherein a cutout is defined on an end of one flange to receive conjunction portion between the pivot shaft and the handle.

16. A heat dissipation device comprising: a heat sink comprising a plurality of fins; a base mounted to a top of the fins; a locking member pivotably attached to the base and movable between locked and unlocked positions; and a fan mounted on the base wherein at the locked position, the locking member presses the fan toward the base to thereby secure the fan on the heat sink, wherein the base forms an outwardly protruding ear and at the locked position the locking member locks with the ear.

17. The heat dissipation device as claimed in claim 16, wherein the base includes a blocking flake engaging with the fan, the blocking flake being located at a side of the base opposite to a side of the base to which the locking member is pivotably attached.

18. The heat dissipation device as claimed in claim 17, wherein the locking member has a pushing section pushing the fan toward the blocking flake.

19. The heat dissipation device as claimed in claim 16 further comprising an additional locking member, the base having a rectangular configuration, the locking member and the additional locking member being pivotably attached to two diagonal corners of the base.

* * * * *